United States Patent
Sonoyama et al.

(10) Patent No.: US 6,512,398 B1
(45) Date of Patent: *Jan. 28, 2003

(54) SEMICONDUCTOR INTEGRATED CIRCUIT DEVICE HAVING REFERENCE VOLTAGE GENERATING SECTION

(75) Inventors: Hirofumi Sonoyama, Kodaira; Yoshiki Kawajiri, Musashino; Masashi Wada, Kodaira; Jun Eto, Oita; Shinji Kawai, Itami, all of (JP)

(73) Assignees: Hitachi, Ltd., Tokyo (JP); Mitsubishi Denki Kabushiki Kaisha, Tokyo (JP); Hitachi ULSI Systems Co., Ltd., Kodaira (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/572,443

(22) Filed: May 17, 2000

(30) Foreign Application Priority Data

May 18, 1999 (JP) .............................................. 11-137630

(51) Int. Cl.[7] .............................................. G01R 19/00
(52) U.S. Cl. ........................................ 327/58; 327/541
(58) Field of Search .................. 327/58, 143, 538–544; 323/315, 316

(56) References Cited

U.S. PATENT DOCUMENTS

| | | | | |
|---|---|---|---|---|
| 5,619,156 A | * | 4/1997 | Jandu | 327/544 |
| 5,852,376 A | * | 12/1998 | Kraus | 327/143 |
| 5,909,141 A | * | 6/1999 | Tomishima | 327/536 |
| 6,147,521 A | * | 11/2000 | Degoirat et al. | 327/74 |
| 6,285,245 B1 | * | 9/2001 | Watanabe | 327/513 |

OTHER PUBLICATIONS

"The 32–Bit NAND Type Flash Memory" by Yoshihisa et al., pp. 32–37 (and English translation thereof, pp. 1–13) dated 1995.

* cited by examiner

Primary Examiner—Kenneth B. Wells
(74) Attorney, Agent, or Firm—Antonelli, Terry, Stout & Kraus, LLP

(57) ABSTRACT

The reliability of a semiconductor integrated circuit device is remarkably improved by minimizing the fluctuations of the detection level of the supply voltage due to the manufacturing process and/or other factors. In the semiconductor integrated circuit device according to the invention, a differential amplifier circuit SA amplifies the differential voltage representing the difference between the reference voltage $V_{REF}$ generated by a reference voltage generating section 16 and the detection voltage obtained by dividing a supply voltage $V_{CC}$ by means of resistors 27 and 28 and outputs it as a detection signal K. The reference voltage generating section 16 generates reference voltage $V_{REF}$ from the base-emitter voltage of a bipolar transistor that is minimally affected by temperature and the manufacturing process so that the fluctuations of the detection level of the supply voltage $V_{CC}$ can be minimized.

10 Claims, 5 Drawing Sheets

SEMICONDUCTOR INTEGRATED CIRCUIT DEVICE HAVING REFERENCE VOLTAGE GENERATING SECTION

TECHNICAL FIELD OF THE INVENTION

This invention relates to the technology of stabilizing the operation of semiconductor integrated circuit devices, and in particular to a technology that can effectively be used to highly accurately detect the level of the supply voltage of a flash memory.

BACKGROUND OF THE INVENTION

Semiconductor integrated circuit devices such as flash memories are generally provided with a so-called supply voltage detector for detecting the voltage being supplied from the power source to drive the semiconductor integrated circuit device and for outputting a detection signal representing the detected voltage.

Thus, the semiconductor integrated circuit device starts accepting external input signals applied to it when the supply voltage detector detects that the supply voltage exceeds a certain level after the device is energized or after a fall of the supply voltage. When the supply voltage is lower than that level, the internal circuits of the semiconductor integrated circuit device are reset.

The supply voltage detector comprises a so-called reference voltage generator that includes a resistor and a MOS (metal oxide semiconductors) transistor; and an inverter which is adapted to receive the generated reference voltage input to the input section of the inverter and to detect the level of the supply voltage on the basis of the reference voltage.

For a more detailed description of semiconductor integrated circuits of the type under consideration, reference should be made, inter alia, to "Denshi-Zairyo (Electronics and Materials)", PP. 32–37, No. 6, Vol. 34, ed. Masashi Oshima, Kogyo-chosakai (Industrial Research Institute), Jun. 1, 1995.

However, the inventors of the present invention have found that the known supply voltage detector arranged in a semiconductor integrated circuit has a drawback as described below.

Namely, the level of the supply voltage as detected by the supply voltage detector can fluctuate depending on the potential of driving the MOS transistor that varies as a function of temperature, the electric current flowing through the resistor, the fluctuations of the logical threshold value of the inverter, the threshold value of the MOS transistor that varies as a function of the manufacturing process, the fluctuations of the resistance of the resistor and/or other factors.

The fluctuations of the detection level have become no longer negligible as a result of the use of a low supply voltage in recent years for semiconductor integrated circuit devices. What is worse, in some cases, such fluctuations can lead to operation errors on the part of the semiconductor integrated circuit device.

SUMMARY OF THE INVENTION

Therefore, an object of the present invention is to provide a semiconductor integrated circuit device whose reliability is remarkably improved by minimizing the fluctuations of the detection level of the supply voltage due to the manufacturing process and/or other factors.

According to the invention, the above objects are achieved by providing a semiconductor integrated circuit device having a supply voltage detecting means, said supply voltage detecting means comprising:

a first reference voltage generating section which, based on an operation control signal, outputs a base-emitter voltage as a reference voltage;

a detection voltage generating section which generates a detection voltage from a supply voltage of the integrated circuit device; and a signal amplifying section which, based on the operation control signal, amplifies a differential voltage between the reference voltage generated by said first reference voltage generating means and the detection voltage generated by said detection voltage generating means and which outputs a detection signal representing said differential voltage.

In another aspect of the invention, there is also provided a semiconductor integrated circuit device having a supply voltage detection means, said supply voltage detecting means comprising:

a second reference voltage generating section which, based on an operation control signal, generates a reference voltage with a band-gap type reference voltage source using a bipolar transistor;

a detection voltage generating section which generates a detection voltage from a supply voltage of the integrated circuit device; and a signal amplifying section which, based on the operation control signal, amplifies a differential voltage between the reference voltage generated by said second reference voltage generating means and the detection voltage generated by said detection voltage generating means and which outputs a detection signal representing said differential voltage.

Preferably, in a semiconductor integrated circuit device according to the present invention, said detection voltage generating section includes first and second resistors connected in series between the supply voltage and the reference voltage so as to generate said detection voltage by dividing said supply voltage.

Preferably, in a semiconductor integrated circuit device according to the present invention, said detection voltage generating section includes an operation control section for operationally controlling the detection voltage generating section based on the operation control signal.

With any of the above described arrangement, some of the major advantages of the present invention will be listed below.

(1) According to an aspect of the present invention, the signal amplifying section amplifies the differential voltage representing the difference between the reference voltage generated by the first reference voltage generating section and the detection voltage generated by the detection voltage generating section, and outputs it as detection signal so that the fluctuations of the supply voltage level can be minimized and highly stabilized.

(2) According to another aspect of the present invention, the signal amplifying section amplifies the differential voltage representing the difference between the reference voltage generated by the second reference voltage generating section by using a band gap type reference voltage source and the detection voltage generated by the detection voltage generating section, and outputs it as detection signal so that the fluctuations of the supply voltage level can be minimized and highly stabilized.

(3) Additionally, according to the present invention, the operation of a semiconductor integrated circuit device can be stabilized to improve the reliability thereof on the basis of (1) and (2) above.

The other objects and the novel features of the present invention will become apparent from the following detailed description made by referring to the accompanying drawings.

BRIEF DESCRIPTIONS OF THE DRAWINGS

DESCRIPTIONS OF THE PREFFERRED EMBODIMENTS

Now, the present invention will be described in detail by referring to the accompanying drawings that illustrate preferred embodiments of the invention.

[Embodiment 1]

Figure 1:
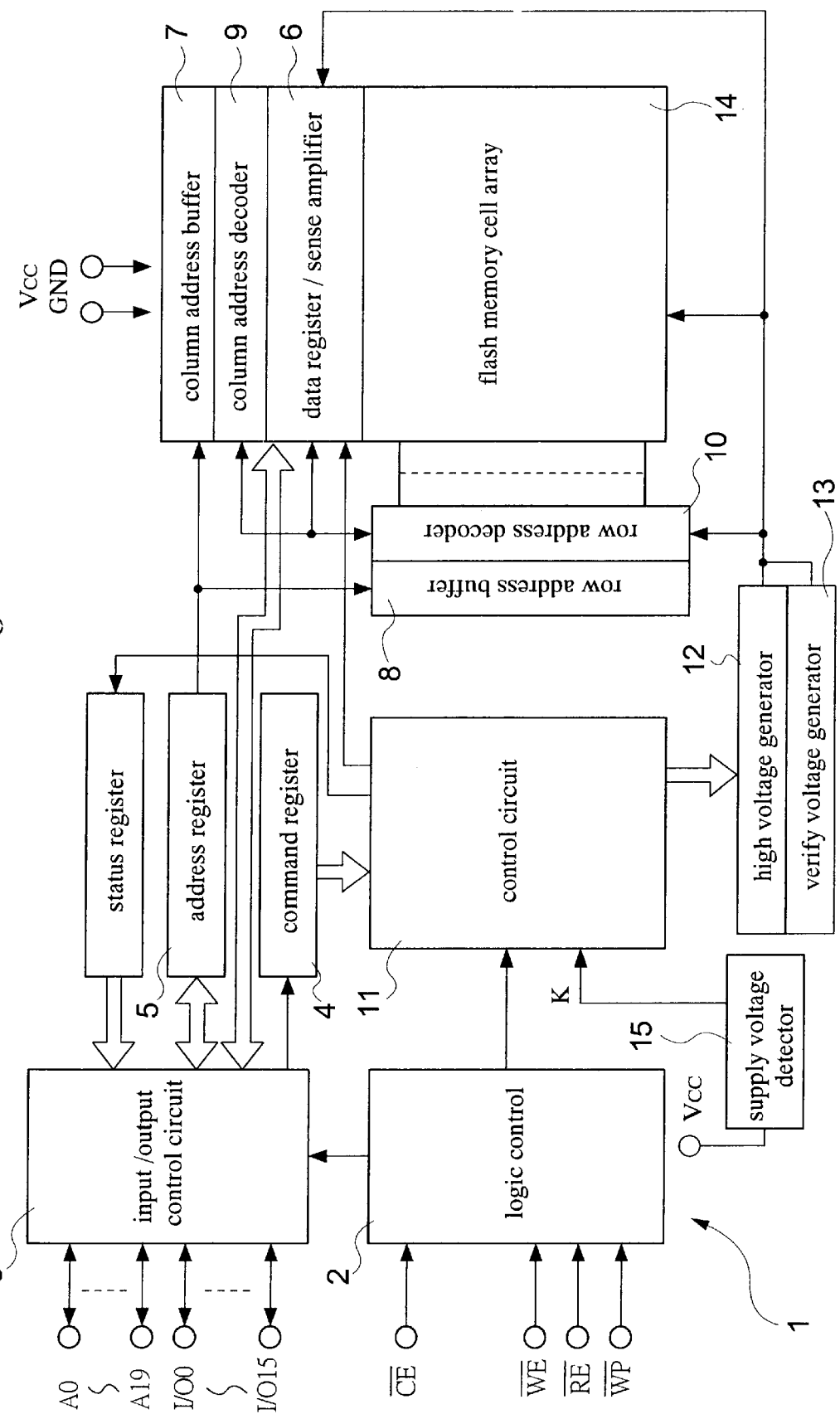
FIG. 1 is a schematic block diagram of a first embodiment of flash memory according to the invention.

Referring to FIG. 1, the first embodiment of flash memory (semiconductor integrated circuit device) 1 according to the invention comprises a logic control 2 and an input/output control circuit 3. The logic control 2 temporarily stores the control signal which is to be input to it from the host connected to it that may be a microcomputer and so on, and the logic control 2 controls the operation logic of the device.

Various signals including a command input from the host, an external address and a program data, are sent to the input/output control circuit 3, which then outputs the command, the external address and the data to a command register 4, an address register 5 and a data register/sense amplifier 6 respectively.

The address register 5 is connected to a column address buffer 7 and a row address buffer 8. The column address buffer 7 and the row address buffer 8 temporarily store the address output from the address register 5.

The column address buffer 7 is connected to a column address decoder 9, while the row address buffer 8 is connected to a row address decoder 10. The column address decoder 9 performs a decoding operation according to the column address output from the column address buffer 7, while the row address decoder 10 performs a decoding operation according to the row address output from the row address buffer 8.

The logic control 2 and the command register 4 are connected to a control circuit 11, which control circuit 11 controls the data register/sense amplifier 6, a high voltage generator 12 and a verify voltage generator 13.

The high voltage generator 12 generates a high voltage to be used as write and erase voltage and hence as word line potential, bit line potential, well potential and source line potential, while the verify voltage generator 13 generates a verify voltage to be used for a verifying operation.

The data register/sense amplifier 6, the column address decoder 9 and the row address decoder 10 are electrically connected to a flash memory cell array 14 that can electrically erase/write a data but does not require any power source for storing data. The flash memory cell array 14 comprises memory cells that are neatly arranged in array as so many smallest units for storing data.

The above described high voltage generator 12 and the verify voltage generator 13 are connected to the data register/sense amplifier 6, the row address decoder 10 and the flash memory cell array 14 to feed them with predetermined respective voltages.

The control circuit 11 is connected to a supply voltage detector (supply voltage detecting means) 15, which supply voltage detector 15 detects the voltage level of the supply voltage $V_{CC}$ that is the operating voltage of the flash memory 1 and outputs the detected voltage level as detection signal K. The control circuit 11 judges that the level of the supply voltage $V_{CC}$ is low and resets the internal circuits until the supply voltage detector 15 outputs a low level detection signal K. When the supply voltage detector 15 outputs a high level detection signal K during a data erasing operation or a data writing operation, the control circuit 11 suspends the ongoing data erasing operation or data writing operation.

Now, the circuit configuration of the supply voltage detector 15 will be described below.

Figure 2:
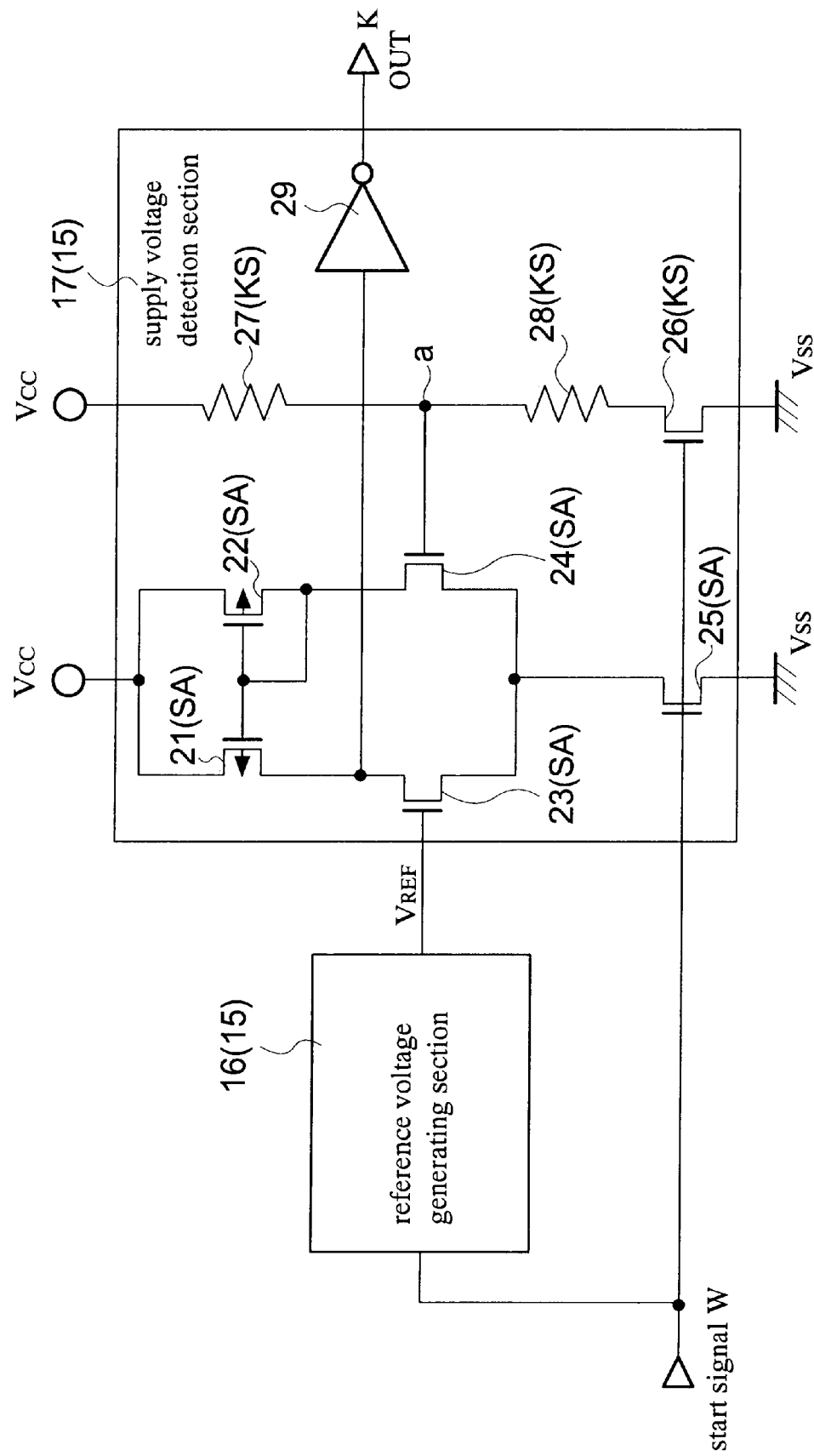
FIG. 2 is a schematic circuit diagram of the supply voltage detector arranged in the flash memory according to the first embodiment of the invention.

Referring to FIG. 2, the supply voltage detector 15 comprises a reference voltage generating section (first reference voltage generating section) 16 and a supply voltage detecting section 17. The reference voltage generating section 16 generates a reference voltage $V_{REF}$ and the supply voltage detecting section 17 compares the reference voltage $V_{REF}$ generated by the reference voltage generating section 16 and the detection voltage obtained by dividing the supply voltage $V_{CC}$ by means of a pair of resistors 27, 28 and, if it is found that the detection voltage is higher than the reference $V_{REF}$, the supply voltage detecting section 17 outputs a low level detection signal K.

Figure 3:
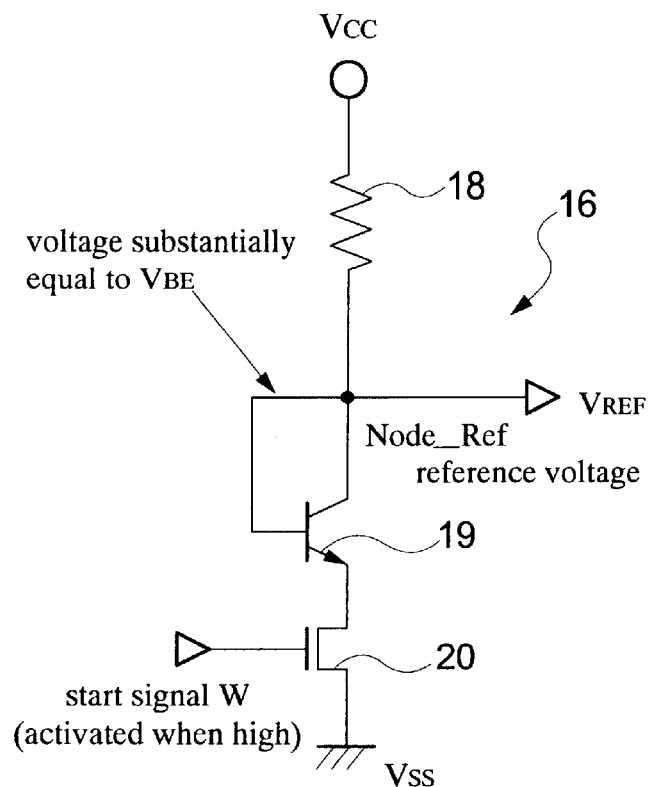
FIG. 3 is a schematic circuit diagram of the reference voltage generating section arranged in the supply voltage detector according to the first embodiment of the invention.

Referring to FIG. 3, the reference voltage generating section 16 comprises a resistor 18, a bipolar NPN-type transistor 19 and a transistor 20 which is an N-channel MOS.

The resistor 18 is fed with supply voltage $V_{CC}$ at one of the contacts thereof and the other contacts thereof is connected to a collector and the base of the transistor 19 respectively the other contact thereof. The collector of the transistor 19 operates as the output terminal of the reference voltage generating section 16 for outputting the reference voltage $V_{REF}$.

An emitter of the transistor 19 is connected to a drain terminal of the transistor 20. A source terminal of the transistor 20 is connected to reference potential $V_{SS}$ and a gate of the transistor 20 is adapted to receive start signal (operation control signal) W that is output from the control circuit 11. The signal W activates the supply voltage detector 15 when it is at level high.

Figure 4:
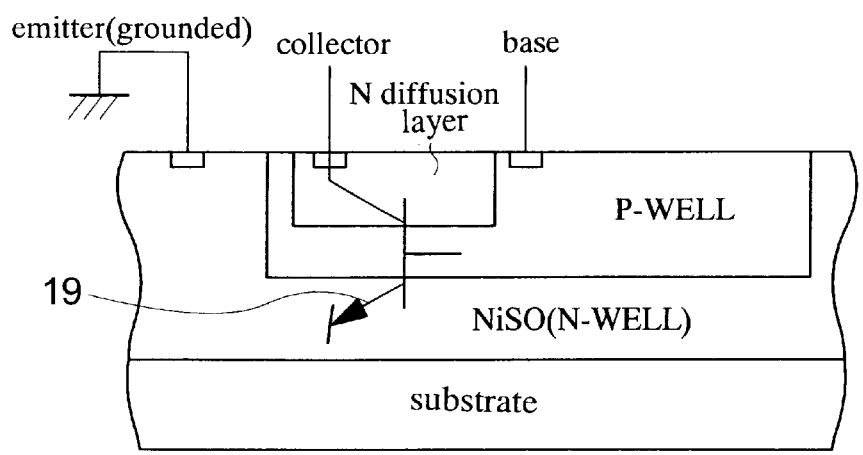
FIG. 4 is a schematic cross sectional view of the bipolar transistor of the reference voltage generating section showing its configuration according to the first embodiment of the invention.

As seen from FIG. 4, the transistor 19 can be manufactured by way of a C (complementary) MOS process (triple well structure) without raising the number of steps when a parasitic bipolar transistor is used for it.

As shown in FIG. 2, the supply voltage detecting section 17 is formed by P-channel MOS transistors 21, 22, N-channel MOS transistors 23 through 26, resistors 27, 28 and an inverter 29. The resistors 27, 28 form a detection voltage generating section KS and the transistors 21 through 25 form a differential amplifier circuit (signal amplifying section) SA.

One of the contacts of each of the transistors 21, 22 and one of the contacts of the resistor (first resistor) 27 are fed with the supply voltage $V_{CC}$. The other contact of the transistor 21 is connected to one of the contacts of the transistor 23, while the other contact of the transistor 22 is connected to one of the contacts of the transistor 24. The gates of the transistors 21, 22 are connected to the other contact of the transistor 22.

The other contact of each of the transistors 23, 24 is connected to one of the contacts of the transistor 25, whose other contact is connected to the reference potential $V_{SS}$.

The other contact of the transistor 21 is connected to the input terminal of the inverter 29, which outputs a detection signal K from its output terminal. The gate of the transistor 23 is adapted to receive the reference voltage $V_{REF}$ generated by the reference voltage generating section 16 and input thereto.

The other contact of the resistor 27 is connected to one of the contacts of the resistor (second resistor) 28 and also to the gate of the transistor 24, while the other contact of the resistor 28 is connected to one of the contacts of the transistor (operation control section) 26.

The other contact of the transistor 26 is connected to the reference potential $V_{SS}$ and the gates of the transistors 25, 26 are adapted to receive a start signal W output from the control circuit 11.

Now, the operation of the above embodiment will be discussed hereinafter.

When detecting the level of the supply voltage $V_{CC}$, a start signal W is output from the control circuit 11 to the supply voltage detector 15. The level of the supply voltage $V_{CC}$ is detected, for example, when the device is energized by the supply voltage or when an operation of erasing or writing data is going on. When the device is energized by the supply voltage and the supply voltage $V_{CC}$ is lower than a certain level, a high level detection signal K is output and the internal circuits are reset. A high level detection signal K is also output when the supply voltage $V_{CC}$ undergoes a certain level during a data erasing or data writing operation. Upon receiving a high level detection signal K, the control circuit 11 temporally suspends the ongoing data erasing or data writing operation.

The supply voltage detector 15 starts to operate as the start signal W output from the control circuit 11 is fed to the gates of the transistors 20, 25, and 26. As the transistor 20 is turned on, a voltage equal to the baseemitter voltage $V_{BE}$ of the bipolar transistor 19 is output from the reference voltage generating section 16 as reference voltage $V_{REF}$.

The reference voltage $V_{REF}$ (base-emitter voltage $V_{BE}$ of the transistor 19) generated by the reference voltage generating section 16 is then input to the supply voltage detecting section 17. The differential amplifier circuit SA of the supply voltage detecting section 17 compares the reference voltage $V_{REF}$ (base-emitter voltage $V_{BE}$ of the transistor 19) and the voltage obtained by dividing the voltage $V_{CC}$ by means of the resistors 27, 28 (detection voltage) which is equal to the voltage at the node a. The differential amplifier circuit SA then amplifies the differential voltage and outputs the amplified voltage to the inverter 9.

If the voltage of the node a is lower than the reference voltage $V_{REF}$, the inverter 29 outputs a high level detection signal K from its output terminal. If, on the other hand, the voltage of the node a is higher than the reference voltage $V_{REF}$, the inverter 29 outputs a low level detection signal K from its output terminal.

The voltage of the node a produced by the voltage division of the resistors 27, 28 is given by formula Va=$V_{CC}$× Rb/(Ra+Rb), where Va is the voltage of the node a and Ra is the resistance of the resistor 27 while Rb is the resistance of the resistor 28.

Figure 5A:
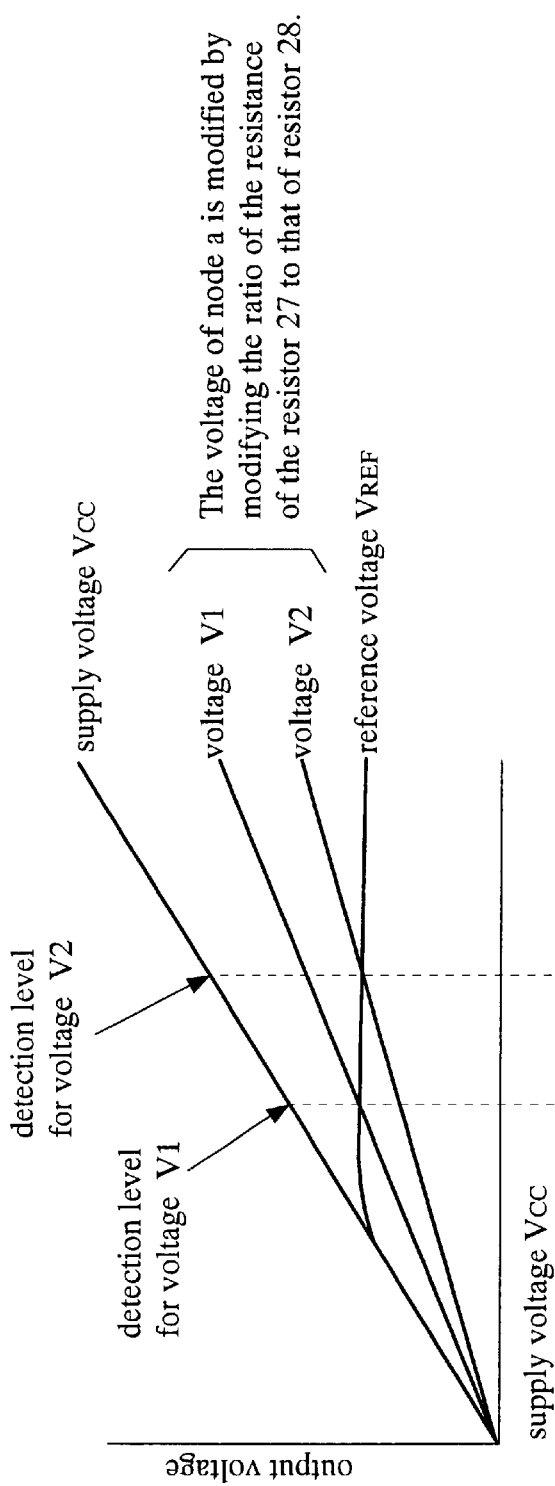
FIG. 5(a) is a graph illustrating how the selected detection level is modified when the ratio of the resistance values of the reference voltage detecting section of the first embodiment is modified.
Figure 5B:
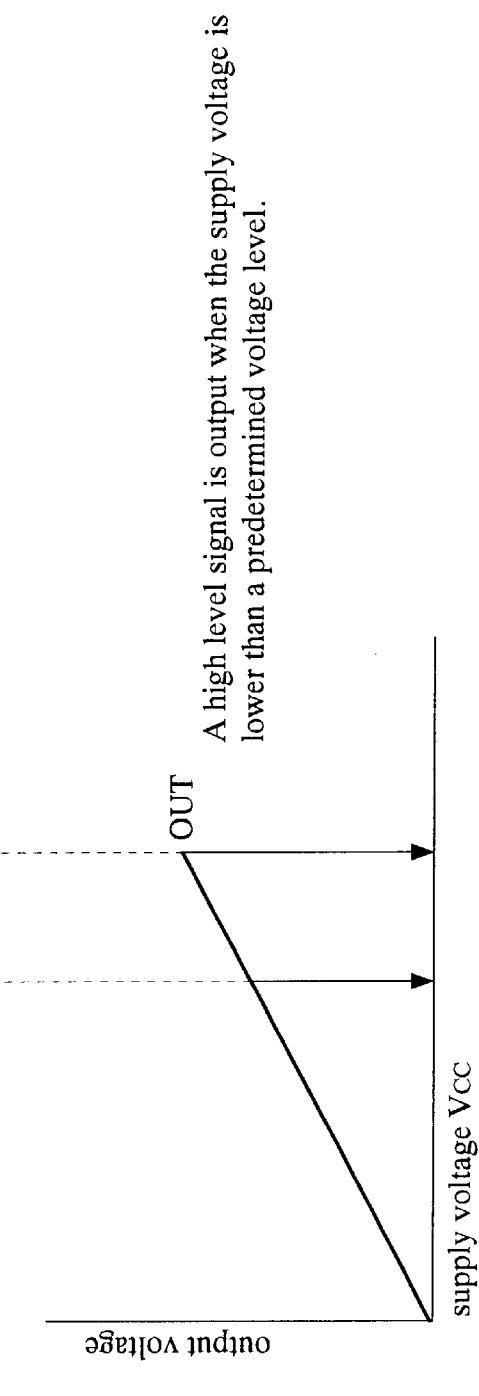
FIG. 5(b) is a graph illustrating the detected supply voltage level when the selected detection level is modified.

Since the voltage of the node a can be held to a desired level by selecting appropriate values for the resistance of the resistor 27 and that of the resistor 28, a correct detection level can be selected for any type of product without problem by modifying the resistance ratio. If voltage V1 or voltage V2 that is lower than voltage V1 is modified for the voltage of the node a by selecting an appropriate value for the resistance ratio of the resistors 27, 28 as shown in FIG. 5(a), the voltage level to be detected is modified to either of the values shown in FIG. 5(B).

Thus, with this first embodiment, reference voltage $V_{REF}$ is produced by means of a bipolar transistor 19 that is minimally affected by temperature and the manufacturing process, and the reference voltage $V_{REF}$ compared with voltage $V_{CC}$ obtained by voltage division, using resistors 27, 28, by means of a differential amplifier circuit SA, so that the fluctuations of the detection level of the supply voltage $V_{CC}$ can be minimized.

Additionally, as a result of minimizing the fluctuations of the detection level of the supply voltage $V_{CC}$, the supply voltage $V_{CC}$ can be detected reliably to improve the reliability of operation even if the device is a flash memory that is driven by a low voltage.

[Embodiment 2]

As in the case of Embodiment 1, this second embodiment of flash memory 1 (FIG. 1) comprises a logic control 2, an input/output circuit 3, a command register 4, an address register 5, a data register/sense amplifier 6, a column address buffer 7, a row address buffer 8, a column address decoder 9, a row address decoder 10, a control circuit 11, a high voltage generator 12, a verify voltage generator 13, a flash memory cell array 14 and a supply voltage detector 15.

Also as in the case of Embodiment 1, the supply voltage detector 15 (FIG. 2) includes a reference voltage generating section (second reference voltage generating section) 16a and a supply voltage detecting section 17. The supply voltage detecting section 17 includes transistors 21, 22, transistors 23 through 26, resistors 27, 28 and inverter 29 as its counterpart of Embodiment 1, although the reference voltage generating section 16a of this embodiment has a circuit configuration different from its counterpart of Embodiment 1.

Figure 6:
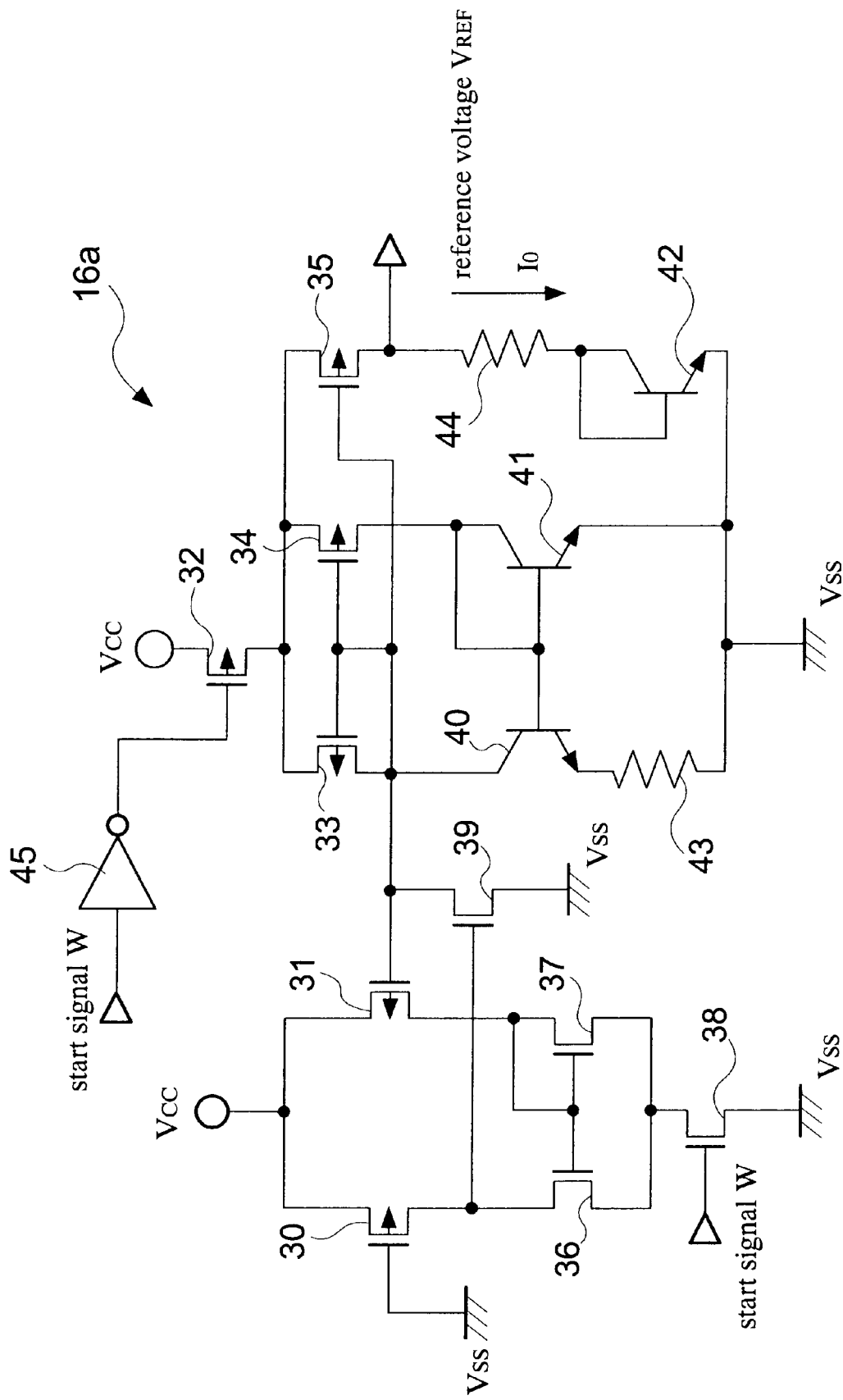
FIG. 6 is a schematic circuit diagram of the reference voltage generating section arranged in the supply voltage detector of a second embodiment of the invention.

Referring to FIG. 6, the reference voltage generating section 16a of this embodiment is formed by P-channel MOS transistors 30 through 35, N-channel MOS transistors 36 through 39, NPN bipolar transistors 40 through 42, resistors 43, 44 and an inverter 45.

The supply voltage $V_{CC}$ is fed to one of the contacts of each of the transistors 30 through 32 and the gate of the transistor 30 is connected to reference potential $V_{SS}$. The other contact of the transistor 30 is connected to one of the contacts of the transistor 36 and to the gate of the transistor 39, while the other contact of the transistor 31 is connected to the gate of the transistor 36 and one of the contacts and the gate of the transistor 37. The other contact of each of the transistors 36, 37 is connected to one of the contacts of the transistor 38.

The other contact of the transistor 38 is connected to reference potential $V_{SS}$ and its gate is so connected that a start signal W from the control circuit 11 is applied to it. The gate of the transistor 31 is connected to one of the contacts of the transistor 39, the gates of the transistors 33 through 35 and the other contact of the transistor 33.

The gate of the transistor 32 is connected to the output terminal of the inverter 45 and the input terminal of the inverter 45 is so connected that a start signal W from the control circuit 11 is applied to it.

The other contact of the transistor 32 is connected to one of the contacts of each of the transistors 33 through 35. The other contact of the transistor 33 is connected to the collector of the transistor 40 and the other contact of the transistor 34 is connected to the collector and the base of the transistor 41 and the base of the transistor 40.

The emitter of the transistor 40 is connected to one of the contacts of the resistor 43 and the other contact of the transistor 35 is connected to one of the contacts of the resistor 44, while the other contact of the transistor 35 operates as the output terminal of the reference voltage generating section 16a for outputting the reference voltage $V_{REF}$.

The other contact of the resistor 44 is connected to the collector and the base of the transistor 42, and the other contact of the resistor 43 and the emitters of the transistors 41, 42 are connected to reference potential $V_{SS}$.

A switch circuit SWC is formed by the transistors 30, 31 and 36 through 39. A band gap circuit BG, or a band gap type reference voltage circuit (band gap type reference voltage source), is formed by the transistors 32 through 35, the transistors 40 through 42 and the resistors 43, 44.

Now, the operation of the reference voltage generating section 16a will be discussed below.

The switch circuit SWC is a start-up circuit that makes the voltage of the gates of the transistors 33 through 35 equal to reference potential $V_{ss}$ when start signal W is at level low but turns off the transistor 39 with a time lag after the activation of the band gap circuit BG when start signal W is at level high which activates the circuit. The voltage of the gates of the transistors 33 through 35 is determined by the band gap circuit BG.

Additionally, the transistor 32 of the band gap circuit BG is turned on by start signal W. Thus, the band gap circuit BG is activated by it.

In the formula of reference voltage $V_{REF}$ (base-emitter voltage $V_{BE}$ of the transistor 42)+I/O×R1, the base-emitter voltage $V_{BE}$ of the transistor 42 shows negative temperature characteristics so that the band gap circuit BG is designed to carry out an operation of temperature compensation with $I_0$ having positive temperature. The temperature characteristics of $I_0$ is determined by the emitter areas of the transistors 40, 41. In the above formula, $I_0$ is the electric current flowing through the resistor 44, and R1 is the resistance of the resistor 44.

As in the case of Embodiment 1, the differential amplifier circuit SA of the supply voltage detecting section 17 compares the reference voltage $V_{REF}$ produced by the reference voltage generating section 16a and the voltage (at the node a) obtained by dividing the voltage $V_{CC}$ by means of the resistors 27, 28 and amplifies the difference, which is then output to the inverter 29. The inverter 29 by turn outputs a detection high level or low level detection signal K.

With this arrangement of the second embodiment, the temperature dependency of the device can be remarkably reduced to improve the accuracy of the voltage detection level of the supply voltage detector 15 because the band gap circuit BG is designed to carry out an operation of temperature compensation for generating reference voltage $V_{REF}$.

Additionally, the supply voltage $V_{CC}$ can be detected reliably to improve the reliability of operation even if the device is a flash memory that is driven by a low voltage.

While the present invention is described above in terms of preferred embodiments, the present invention is by no means limited to those embodiments, which may be modified or altered without departing from the scope of the invention.

What is claimed is:

1. A semiconductor integrated circuit device having a supply voltage detecting means, said supply voltage detecting means comprising:

a reference voltage generating section which, based on an operation control signal, outputs a base-emitter voltage of a bipolar transistor as a first reference voltage;

a detection voltage generating section which generates a detection voltage from a supply voltage of the integrated circuit device; and a signal amplifying section which, based on the operation control signal, amplifies a differential voltage between the first reference voltage generated by said reference voltage generating means and the detection voltage generated by said detection voltage generating means and which outputs a detection signal representing said differential voltage, wherein said reference voltage generating section includes a first MOS transistor between said supply voltage and a second reference voltage serially connected to said bipolar transistor, p1 wherein said detection voltage generating section includes a second MOS transistor between said supply voltage and a second reference voltage, wherein said signal amplifying section serially connects a third MOS transistor between said supply voltage and a second reference voltage, and said first to third MOS transistors are controlled by said operation control signal.

2. A semiconductor integrated circuit device according to claim 1, wherein said detection voltage generating section includes first and second resistors connected in series between the supply voltage and the second reference voltage so as to generate said detection voltage by dividing said supply voltage.

3. A semiconductor integrated circuit device according to claim 2, wherein said detection voltage generating section includes an operation control section for operationally controlling the detection voltage generating section based on the operation control signal.

4. A semiconductor integrated circuit device according to claim 1, wherein said detection voltage generating section includes an operation control section for operationally controlling the detection voltage generating section based on the operation control signal.

5. A semiconductor integrated circuit device having a nonvolatile memory according to claim 1, wherein said nonvolatile memory is structured by Complementary Metal Oxide Semiconductor process, which structures a semiconductor substrate, a first semiconductor region of N type in said semiconductor substrate, a second semiconductor region of P type in said first semiconductor region and a third semiconductor region of N type in said second semiconductor region, wherein said bipolar transistor is structured by said Complementary Metal Oxide Semiconductor process, said first semiconductor region being said emitter, said second semiconductor region being a base and said third semiconductor region being a collector.

6. A semiconductor integrated circuit device having a supply voltage detection means, said supply voltage detecting means comprising:

a reference voltage generating section which, based on an operation control signal, generates a first reference voltage with a band-gap reference voltage source using a bipolar transistor;

a detection voltage generating section which generates a detection voltage from a supply voltage of the integrated circuit device; and a signal amplifying section which, based on the operation control signal, amplifies a differential voltage between the first reference voltage generated by said reference voltage generating means and the detection voltage generated by said detection voltage generating means and which outputs a detection signal representing said differential voltage, wherein said reference voltage generating section includes a first MOS transistor between said supply voltage and a second reference voltage serially connected to said bipolar transistor, wherein said detection voltage generating section includes a second MOS transistor between said supply voltage and a second reference voltage, wherein said signal amplifying section serially connects a third MOS transistor between said supply voltage and a second reference voltage, and said first to third MOS transistors are controlled by said operation control signal.

7. A semiconductor integrated circuit device according to claim 6, wherein said detection voltage generating section includes first and second resistors connected in series between the supply voltage and the second reference voltage so as to generate said detection voltage by dividing said supply voltage.

8. A semiconductor integrated circuit device according to claim 7, wherein said detection voltage generating section includes an operation control section for operationally controlling the detection voltage generating section based on the operation control signal.

9. A semiconductor integrated circuit device according to claim 6, wherein said detection voltage generating section includes an operation control section for operationally controlling the detection voltage generating section based on the operation control signal.

10. A semiconductor integrated circuit device having a nonvolatile memory according to claim 6, wherein said nonvolatile memory is structured by Complementary Metal Oxide Semiconductor process, which structures a semiconductor substrate, a first semiconductor region of N type in said semiconductor substrate, a second semiconductor region of P type in said first semiconductor region and a third semiconductor region of N type in said second semiconductor region, wherein said bipolar transistor is structured by said Complementary Metal Oxide Semiconductor process, said first semiconductor region being said emitter, said second semiconductor region being a base and said third semiconductor region being a collector.

* * * * *